United States Patent
Shei et al.

(10) Patent No.: US 7,105,860 B2
(45) Date of Patent: Sep. 12, 2006

(54) FLIP CHIP LIGHT-EMITTING DIODE PACKAGE

(75) Inventors: Shih-Chang Shei, Tainan (TW); Jinn-Kong Sheu, Tainan (TW)

(73) Assignee: Epitech Technology Corporation, Tainan (TW)

( * ) Notice: Subject to any disclaimer, the term of this patent is extended or adjusted under 35 U.S.C. 154(b) by 0 days.

(21) Appl. No.: 10/710,421

(22) Filed: Jul. 9, 2004

(65) Prior Publication Data
US 2005/0205887 A1 Sep. 22, 2005

(30) Foreign Application Priority Data
Mar. 22, 2004 (TW) ............................. 93107618 A

(51) Int. Cl.
*H01L 29/22* (2006.01)
*H01L 23/52* (2006.01)
(52) U.S. Cl. ..................... 257/99; 257/79; 257/90; 257/355; 257/778; 257/E33.052; 257/E33.056
(58) Field of Classification Search .................. 257/99, 257/79, 90, 778, 355, E33.052, E33.056
See application file for complete search history.

(56) References Cited
U.S. PATENT DOCUMENTS 6,900,698 B1 * 5/2005 Ikeda .......................... 330/298
2002/0179914 A1 * 12/2002 Sheu ............................ 257/90
2004/0157432 A1 * 8/2004 Yonezawa et al. ........... 438/637

* cited by examiner

*Primary Examiner*—Jerome Jackson
*Assistant Examiner*—Joseph Nguyen
(74) *Attorney, Agent, or Firm*—Jianq Chyun IP Office

(57) ABSTRACT

A flip chip light-emitting diode package comprising a Schottky diode group, a light-emitting diode and a plurality of bumps is provided. The Schottky diode group comprises a plurality of Schottky diodes electrically coupled in series or in parallel. The bumps are disposed between one of the Schottky diodes and the light-emitting diode so that the Schottky diode group and the light-emitting diode are connected reverse and in parallel. The light-emitting diode is disposed on one of the Schottky diodes and connected together by a flip-chip bonding process. The flip chip light-emitting diode package prevents damaging from electrostatic discharge and promotes light extraction efficiency. In addition, the submount of the Schottky diode is fabricated by using silicon material. Since silicon is an excellent material for heat dissipating, light extraction efficiency and reliability of the package is increased.

26 Claims, 4 Drawing Sheets

FLIP CHIP LIGHT-EMITTING DIODE PACKAGE

CROSS REFERENCE TO RELATED APPLICATIONS

This application claims the priority benefit of Taiwan application serial no. 93107618, filed on Mar. 22, 2004.

BACKGROUND OF INVENTION

1. Field of the Invention

The present invention relates to a flip chip light-emitting diode package. More particularly, the present invention relates to a flip chip light-emitting diode package capable of preventing damage from electrostatic discharge, promoting emission efficiency and thermal dissipation characteristics to increase lifetime.

2. Description of Related Art

In recent years, III–V nitride semiconductor materials have been utilized to fabricate high-temperature devices and opto-electronic devices capable of emitting light in the blue to ultraviolet wavelength range. In particular, nitride based compounds semiconductor that contains group III–V elements including GaN, GaAlN and InGaN have been used to fabricate various types of light-emitting diodes.

FIG. 1A is an equivalent circuit diagram of a conventional flip chip light-emitting diode package. To prevent any electrostatic discharge (ESD) from damaging the light-emitting diode structure 30, the light-emitting diode 30 is connected in parallel with a Zener diode 40. The Zener diode 40 is always being turned on because the Zener diode 40 operates at a breakdown region. When a forward bias voltage is applied to the two terminals V+ and V− of the light-emitting diode 30, carriers in the P-N junction of the light-emitting diode 30 generate a forward current leading to the emission of light. However, if an abnormal voltage or static charge is applied to the light-emitting diode 30, excess voltage will discharge through the Zener diode 40 operating at the breakdown region. The discharge current passes through the Zener diode 40 instead of the light-emitting diode 30 so that the light-emitting diode 30 is protected against irreversible damage due to an abnormal voltage or large static electricity discharge.

FIG. 1B is a schematic cross-sectional view of a conventional flip chip light-emitting diode package. As shown in FIG. 1B, a transparent substrate 32, an N-doped GaN layer 34, a P-doped GaN layer 36 and electrodes 38a, 38b together form the group III–V GaN light-emitting diode 30 in FIG. 1A and an N-doped silicon 42, a P-doped silicon 44 and metallic layers 46a, 46b together form the Zener diode 40 in FIG. 1A. The bumps 50a and 50b shown in FIG. 1B are made from a solder material. Through the bumps 50a and 50b, the P-doped silicon 44 is electrically coupled to the N-doped GaN layer 34 and the N-doped silicon 42 is electrically coupled to the P-doped GaN layer 36 so that an equivalent circuit as shown in FIG. 1A is formed.

In a normal operation, a forward bias voltage is applied to the V+ and V− terminal of the flip chip light-emitting diode 30 so that a current flows from the P-doped GaN layer 36 to the N-doped GaN layer 34 to produce light. The light so generated extracts from the transparent substrate 32. When an abnormal voltage or static charge is applied to the terminals V+ and V−, the excess voltage causes a discharge current through the N-doped silicon 42 to the P-doped silicon 44 without passing through the light-emitting diode 30.

Although the aforementioned structure protects the light-emitting diode against ESD, additional processes are required to form the P-doped silicon 44 within the N-doped silicon 42. The most common technique of forming the P-doped silicon 44 within the N-doped silicon 42 includes an ion implantation method. The ion implantation method is capable of forming a doped region having a given depth more accurately than a conventional diffusion method. However, forming the P-doped silicon 44 within the flip chip light-emitting diode package demands an accurate control of the dosage as well as energy through the ion accelerator of an ion implant equipment. Hence, expensive equipment (ion implant equipment and accessory gas supply system and vacuum system) must be purchased and a lot of time must be spent to produce a package with this structure.

SUMMARY OF INVENTION

Accordingly, the present invention is directed to a flip chip light-emitting diode package having a Schottky diode and a light-emitting diode reverse and parallel connected to provide the package with electrostatic discharge (ESD) protection.

The present invention is directed to a flip chip light-emitting diode package without the need to fabricate another doped region on a submount of the light-emitting diode. Hence, the number of steps for producing the flip chip light-emitting diode package is reduced.

According to an embodiment of the invention, the flip chip light-emitting diode package comprises a Schottky diode and a light-emitting diode. The light-emitting diode is disposed on the Schottky diode by flip chip bonding process and the light-emitting diode and the Schottky diode are reverse and parallel connected.

According to one embodiment of the present invention, the flip chip light-emitting diode package further comprises a plurality of solder bumps. The solder bumps are disposed between the Schottky diode and the light-emitting diode such that the Schottky diode and the light-emitting diode are reverse and parallel connected.

According to one embodiment of the present invention, the light-emitting diode of the flip chip light-emitting diode package further comprises a substrate, a semiconductor layer, a first electrode and a second electrode. The semiconductor layer is disposed on the substrate. The semiconductor layer at least includes a first conductive type doped semiconductor layer, a second conductive type doped semiconductor layer and a light-emitting layer. The light-emitting layer is disposed over the first conductive type doped semiconductor layer and the second conductive type doped semiconductor layer is disposed over the light-emitting layer. In addition, the first electrode is disposed over the first conductive type doped semiconductor layer and the second electrode is disposed over the second conductive type doped semiconductor layer. The second electrode is an N-type transparent conductive oxide layer or a P-type transparent conductive oxide layer, for example.

According to one embodiment of the present invention, the Schottky diode of the flip chip light-emitting diode package further comprises a submount, an ohmic contact layer and a Schottky contact layer. The submount has a first surface and a second surface. The ohmic contact layer is disposed on a portion of the first surface and the second surface of the submount. The Schottky contact layer is disposed on a portion of the first surface of the submount. The ohmic contact layer and the Schottky contact layer are electrically isolated.

The present invention is also directed to an alternative flip chip light-emitting diode package. The flip chip light-emitting diode package comprises a Schottky diode group and a light-emitting diode. The Schottky diode group comprises a plurality of Schottky diodes. Furthermore, the Schottky diodes are connected in series, in parallel or partially in series and partially in parallel. The light-emitting diode is disposed on one of the Schottky diodes by flip chip bonding process and the light-emitting diode is reverse and parallel connected with the Schottky diode group.

According to one embodiment of the present invention, the flip chip light-emitting diode package further comprises a plurality of solder bumps. The solder bumps are disposed between one of the Schottky diodes and the light-emitting diode such that one of the Schottky diodes and the light-emitting diode are connected reverse and in parallel.

According to one embodiment of the present invention, the light-emitting diode of the flip chip light-emitting diode package further comprises a substrate, a semiconductor layer, a first electrode and a second electrode. The semiconductor layer is disposed on the substrate. The semiconductor layer at least includes a first conductive type doped semiconductor layer, a second conductive type doped semiconductor layer and a light-emitting layer. The light-emitting layer is disposed over the first conductive type doped semiconductor layer and the second conductive type doped semiconductor layer is disposed over the light-emitting layer. In addition, the first electrode is disposed over the first conductive type doped semiconductor layer and the second electrode is disposed over the second conductive type doped semiconductor layer. The second electrode is an N-type transparent conductive oxide layer or a P-type transparent conductive oxide layer, for example.

According to one embodiment of the present invention, each Schottky diode of the flip chip light-emitting diode package further comprises a submount, a ohmic contact layer and a Schottky contact layer. The submount has a first surface and a second surface. The ohmic contact layer is disposed on a portion of the first surface and the second surface of the submount. The Schottky contact layer is disposed on a portion of the first surface of the submount. The ohmic contact layer and the Schottky contact layer are electrically isolated.

The flip chip light-emitting diode package of the present invention comprises at least one Schottky diode. Hence, there is no need to provide additional steps for fabricating another doped region on the submount of the diode. With fewer steps for fabricating the flip chip light-emitting diode package, production cost of the package is reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
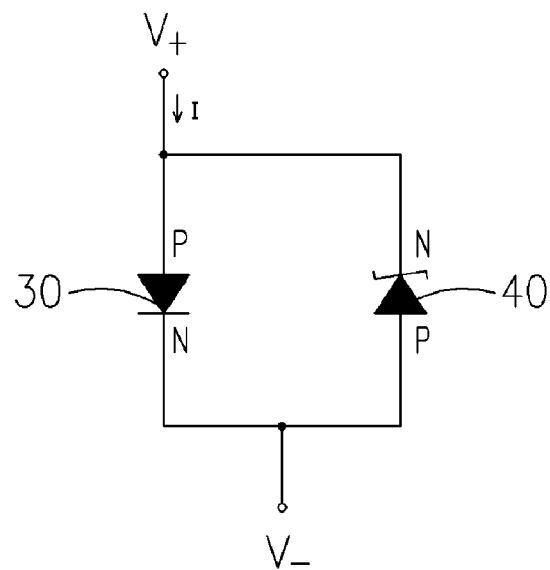
FIG. 1A is an equivalent circuit diagram of a conventional flip chip light-emitting diode package.
Figure 1B:
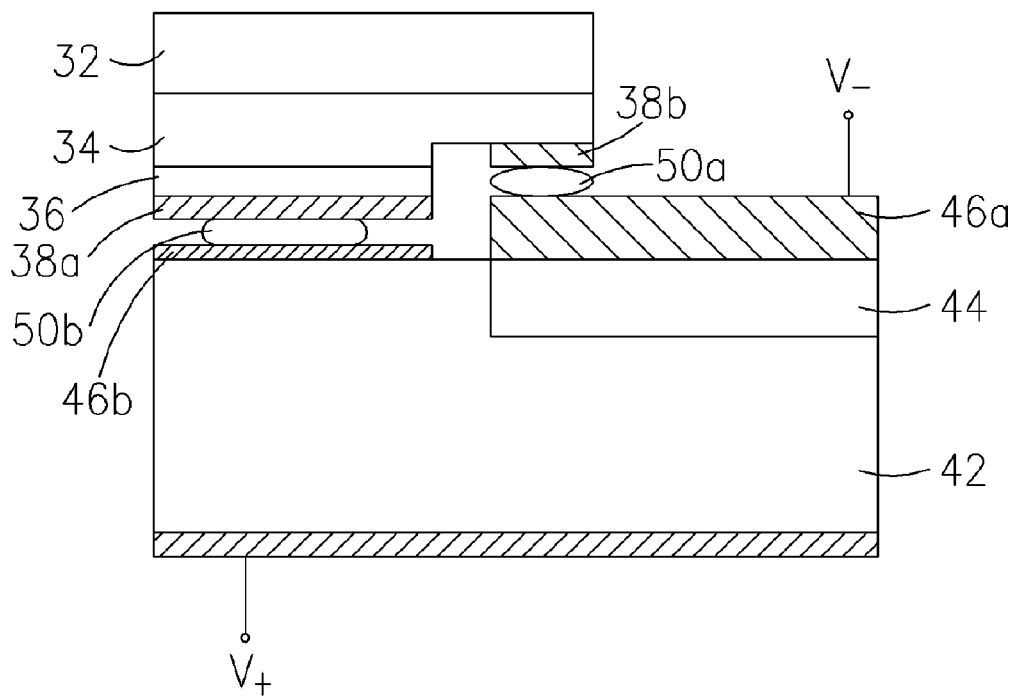
FIG. 1B is a schematic cross-sectional view of a conventional flip chip light-emitting diode package.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
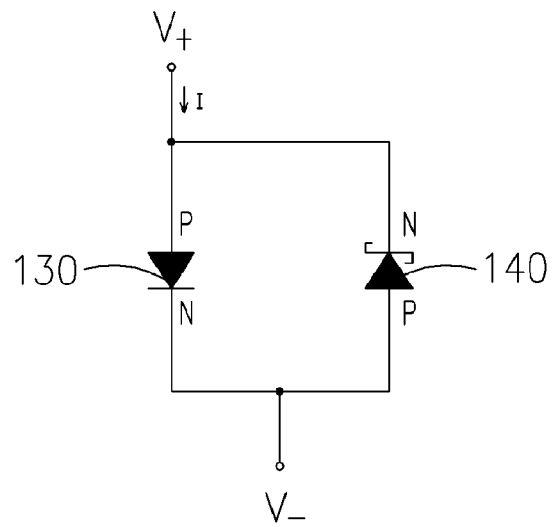
FIG. 2A is an equivalent circuit diagram of a flip chip light-emitting diode package according to the first embodiment of the present invention.
Figure 2B:
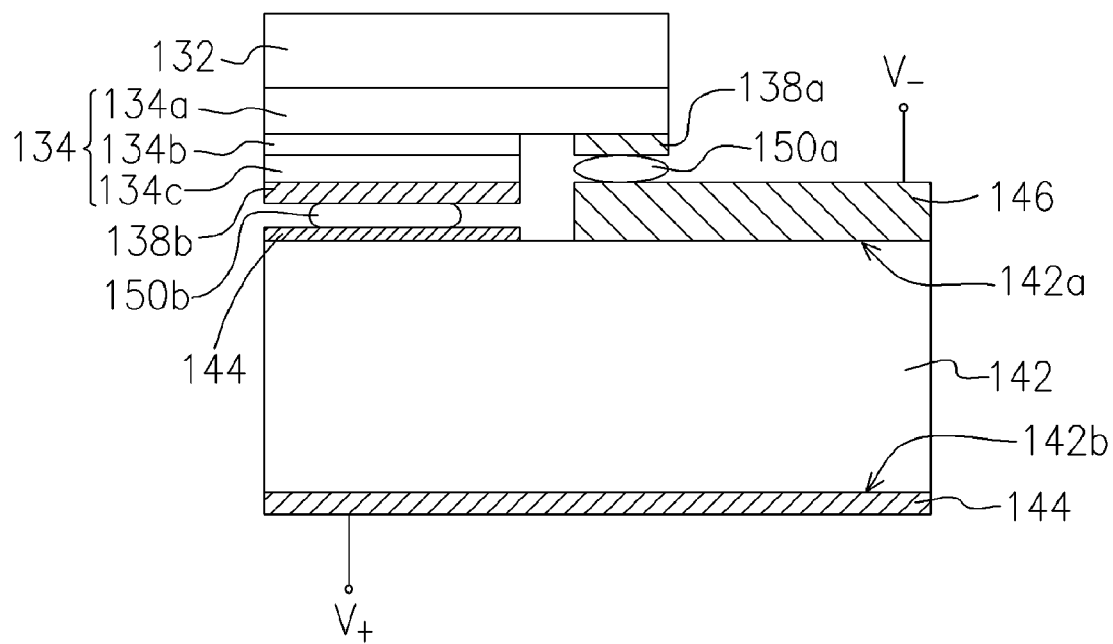
FIG. 2B is a schematic cross-sectional view of a flip chip light-emitting diode package according to the first embodiment of the present invention.

FIG. 2A is an equivalent circuit diagram of a flip chip light-emitting diode package according to a first embodiment of the present invention. FIG. 2B is a schematic cross-sectional view of a flip chip light-emitting diode package according to the first embodiment of the present invention. In the first embodiment of the present invention, the flip chip light-emitting diode package comprises at least a Schottky diode 140, a light-emitting diode 130 and a plurality of solder bumps 150a and 150b. The light-emitting diode 130 is disposed on the Schottky diode 140 by flip chip bonding process. The solder bumps 150a and 150b are disposed between the Schottky diode 140 and the light-emitting diode 130 for electrically connecting with the Schottky diode 140 and the light-emitting diode 130 together. Through the solder bumps 150a and 150b, the Schottky diode 140 and the light-emitting diode 130 are connected reverse and in parallel.

In the present embodiment, the light-emitting diode further comprises a substrate 132, a semiconductor layer 134, a first electrode 138a and a second electrode 138b. The substrate 132 comprises a transparent material, for example. The semiconductor layer 134 is disposed over the substrate 132. The semiconductor layer 134 at least comprises a first conductive type doped semiconductor layer 134a, a second conductive type doped semiconductor layer 134c and a light-emitting layer 134b. The light-emitting layer 134b is disposed over the first conductive type doped semiconductor layer 134a while the second conductive type doped semiconductor layer 134c is disposed over the light-emitting layer 134b.

As shown in FIGS. 2A and 2B, the first electrode 138a is disposed over the first conductive type doped semiconductor layer 134a and the second electrode 138b is disposed over the second conductive type doped semiconductor layer 134c. The first electrode 138a is fabricated by using Ti/Al, Cr/Au, Cr/Pt/Au, Cr/Pd/Au or Cr/Ti/Au, for example. Furthermore, the first electrode 138a can be an N-type transparent conductive oxide layer or a P-type transparent conductive oxide layer as well. The second electrode 138b is preferably fabricated using Ni/Au, Pd/Au, Pt/Au, Ti/Au, Cr/Au, Sn/Au or Ta/Au, for example. In addition, the second electrode 138b can be an N-type transparent conductive oxide layer or a P-type transparent conductive oxide layer. In particular, the N-type transparent conductive oxide layer is fabricated using ITO or CTO and the P-type transparent conductive oxide layer is fabricated using $CuAlO_2$ or $SrCu_2O_2$, for example.

The Schottky diode 140 comprises a submount 142, an ohmic contact layer 144 and a Schottky contact layer 146. The submount 142 has a first surface 142a and a second surface 142b. The ohmic contact layer 144 is disposed on a portion of the first surface 142a and the second surface 142b of the submount 142. Furthermore, the Schottky contact layer 146 is disposed on a portion of the first surface 142a of the submount 142. It should be noted that the ohmic contact layer 144 and the Schottky contact layer 146 are electrically isolated. The ohmic contact layer 144 is fabricated using aluminum (Al) while the Schottky ohmic layer 146 is fabricated using titanium (Ti), nickel (Ni), gold (Au), tungsten (W), silver (Ag) or platinum (Pt), for example. The submount 142 is an N-doped or a P-doped layer fabricated using Si, GaAs, GaP, GaN or ZnO, for example.

The light-emitting diode 130 and the Schottky diode 140 are connected reverse and in parallel so that the light-emitting diode package is protected against damage due to a sudden electrostatic discharge (ESD). When a normal forward bias voltage is applied to the V+ and V− terminals of the light-emitting diode 130, carriers passing through the P-N junction of the light-emitting diode 130 produce a forward current so that the light-emitting diode 130 emits light. However, if an abnormal voltage or a static discharge voltage is applied to the V+ and V− terminals of the light-emitting diode 130, the excess voltage forces a discharge through the Schottky diode 140 operating in the breakdown region. Since the discharge current is re-routed through the Schottky diode 140 instead of the light-emitting diode 130, the light-emitting diode 130 is protected against any structural damage due to a sudden surge in current or voltage.

Figure 3A:
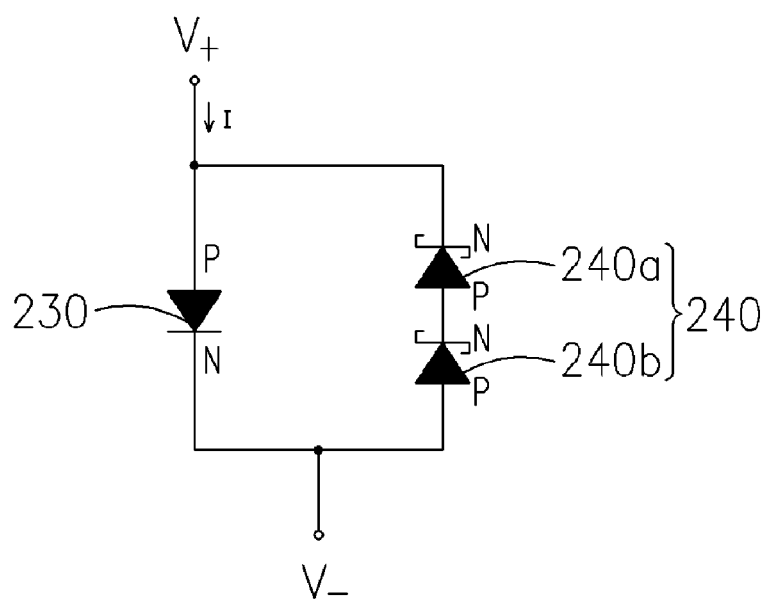
FIG. 3A is an equivalent circuit diagram of a flip chip light-emitting diode package having a serially connected Schottky diode group according to a second embodiment of the present invention.

FIG. 3A is an equivalent circuit diagram of a flip chip light-emitting diode package having a serially connected Schottky diode group according to a second embodiment of the present invention. The flip chip light-emitting diode package in the second embodiment comprises a light-emitting diode 230 and a Schottky diode group 240. The Schottky diode group 240 comprises two Schottky diodes 240a and 240b electrically connected in series.

As shown in FIG. 3A, the light-emitting diode 230 is disposed on the Schottky diode 240a or 240b by flip-chip bonding process. The light-emitting diode 230 and the Schottky diode group 240 are connected reverse and in parallel. When an abnormal voltage or static discharge voltage appears between the terminals of the flip chip light-emitting diode package, the excess voltage forces a current through the Schottky diodes 240a and 240b without going through the light-emitting diode 230. Hence, the light-emitting diode 230 can operate normally and has a longer lifetime. Moreover, the tolerant static discharge voltage of the light-emitting diode that is serially connected with Schottky diodes 240a, 240b is much higher than that connected with either the Schottky diode 240a or 240b alone. Therefore, the Schottky diode group 240 is much better at protecting the light-emitting diode 230 against a high voltage discharge. The light-emitting diode 230 has a structure identical to the light-emitting diode 130 in the first embodiment. Furthermore, the Schottky diodes 240a and 240b have a structure identical to the Schottky diode 140 in the first embodiment too.

Figure 3B:
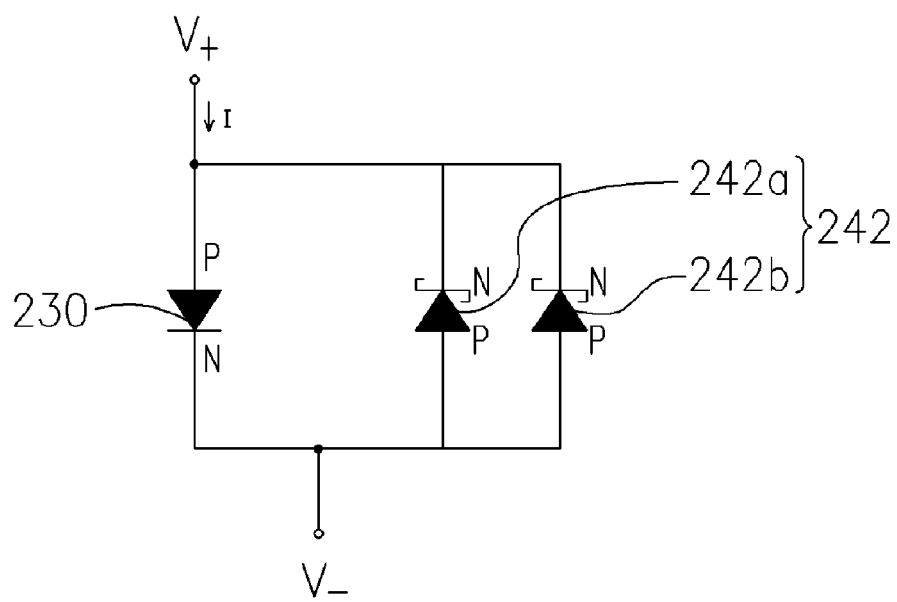
FIG. 3B is an equivalent circuit diagram of a flip chip light-emitting diode package having a parallel connected Schottky diode group according to the first embodiment of the present invention.

FIG. 3B is an equivalent circuit diagram of a flip chip light-emitting diode package having a parallel connected Schottky diode group according to the first embodiment of the present invention. The flip chip light-emitting diode package in the third embodiment comprises a light-emitting diode 230 and a Schottky diode group 242. The Schottky diode group 242 comprises two Schottky diodes 242a and 242b electrically connected in parallel.

As shown in FIG. 3B, the light-emitting diode 230 is disposed on the Schottky diode 242a or 242b by flip-chip bonding process. The light-emitting diode 230 and the Schottky diode group 242 are reverse and parallel connected. With two Schottky diodes 242a and 242b connected in parallel, the Schottky diode group 242 can still be stably operating within package even if the Schottky diode 242a or 242b is damaged or vice versa. When an abnormal voltage or static discharge voltage appears between the terminals of the flip chip light-emitting diode package, the excess voltage forces a current through the Schottky diode group 242 without passing through the light-emitting diode 230. Similarly, the light-emitting diode 230 has a structure identical to the light-emitting diode 130 in the first embodiment. Furthermore, the Schottky diodes 242a and 242b have a structure identical to the Schottky diode 140 in the first embodiment too.

Figure 3C:
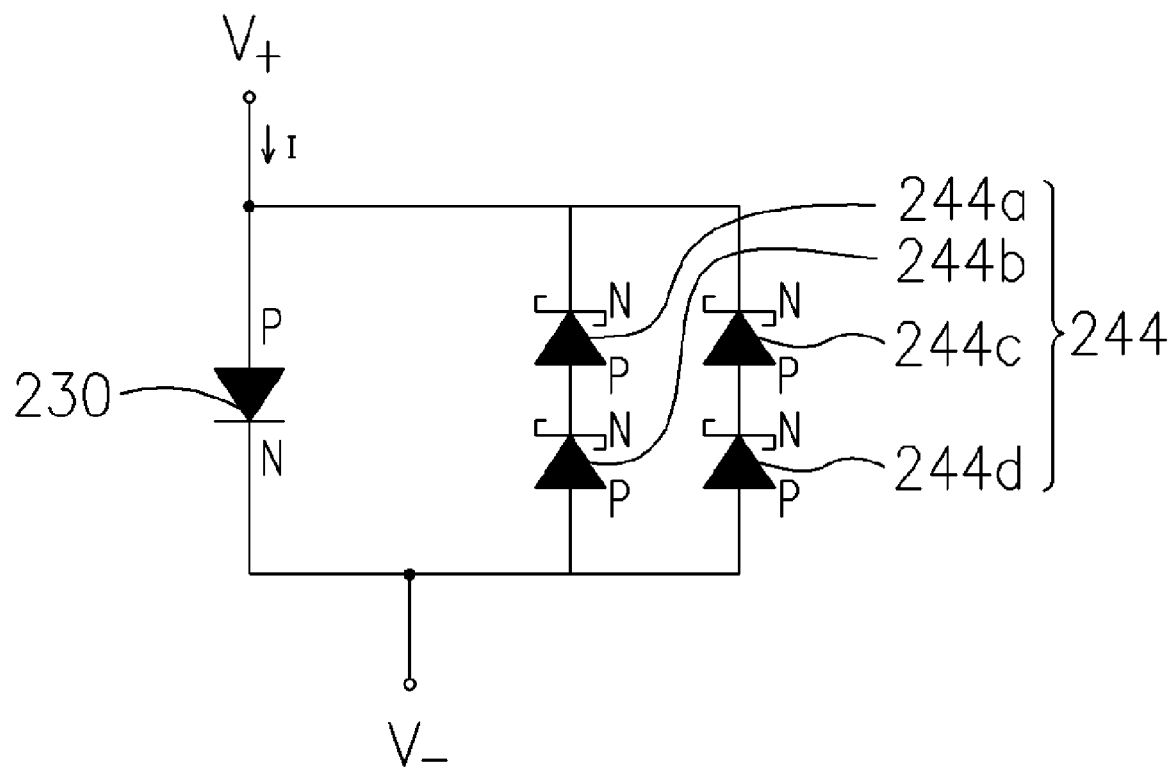
FIG. 3C is an equivalent circuit diagram of a flip chip light-emitting diode package having a parallel and serially connected with Schottky diode group according to the second and the third embodiment of the present invention.

FIG. 3C is an equivalent circuit diagram of a flip chip light-emitting diode package having a parallel and serially connected with Schottky diode group according to the second and the third embodiment of the present invention. The flip chip light-emitting diode package in the fourth embodiment comprises a light-emitting diode 230 and a Schottky diode group 244. The Schottky diode group 244 comprises four Schottky diodes 244a, 244b, 244c and 244d. The Schottky diodes 244a and 244b are electrically connected in series and the Schottky diodes 244c and 244d are electrically connected in series too. However, the serially connected Schottky diode pair 244a, 244b and the serially connected Schottky diode pair 244c, 244d are electrically connected in parallel.

As shown in FIG. 3C, the light-emitting diode 230 is disposed on the Schottky diode 244a, 244b, 244c or 244d by flip-chip bonding process. The light-emitting diode 230 and the Schottky diode group 244 are connected reverse and in parallel. With two pairs of Schottky diodes 244a, 244b and 244c, 244d connected in parallel, the Schottky diode pair 244c, 244d can still be stably operating within package even if the Schottky diode pair 244a, 244b is damaged or vice versa. When an abnormal voltage or static discharge voltage appears between the terminals of the flip chip light-emitting diode package, the excess voltage forces a current through the Schottky diode pair 244a, 244b or 244c, 244d without passing through the light-emitting diode 230.

In addition, the tolerant static discharge voltage of light-emitting diode that is serially connected with Schottky diode pair 244a, 244b or 244c, 244d is much higher than that of either the Schottky diode 244a or 244b alone or the Schottky diode 244c or 244d alone. Therefore, the Schottky diode group 244 is much better at protecting the light-emitting diode 230 against a high voltage discharge. The light-emitting diode 230 has a structure identical to the light-emitting diode 130 in the first embodiment. Furthermore, the Schottky diodes 244a, 244b, 244c and 244d have a structure identical to the Schottky diode 140 in the first embodiment too.

In summary, the Schottky diode inside the flip chip light-emitting diode package of the present invention has a submount fabricated using silicon material. Since silicon is an excellent material for heat dissipating, the Schottky diode is prevented from overheating as a current passing through. Therefore, the light-emitting diode is protected from occasional electrostatic discharge so that the light-emitting diode package can have a longer lifetime.

In addition, the light-emitting diode is inverted to connect with the Schottky diode in parallel to form a flip-chip package structure. This prevents light extraction from blocking caused by the electrodes of the light-emitting diode. Thus, all the light produced by the light-emitting layer of the light-emitting diode is permitted to pass through the transparent substrate of the light-emitting diode and the light extraction efficiency can be increase.

In the flip chip light-emitting diode package of the present invention, the Schottky diodes within the Schottky diode group are electrically connected in series, in parallel or in series and in parallel. Furthermore, the Schottky diode group and the light-emitting diode are connected reverse and in parallel. Hence, if the Schottky diodes in the diode group are connected in parallel and one of the diodes fail to function, the other diodes in the diode group can still keep a normal operation for the package. On the other hand, if the Schottky diodes in the diode group are connected in series, the serially connected Schottky diodes can tolerate a higher voltage surge than a Schottky diode alone. Therefore, the entire group of serially connected Schottky diodes is much better for providing a normal operation and extending the lifetime of the package. Similarly, if the Schottky diodes are arranged to connect in series and in parallel, all the advantages of a package having a serially connected with Schottky diodes and a package having a parallel connected with Schottky diodes are combined.

It should be noted that the present invention incorporates Schottky diodes inside the flip chip light-emitting diode package. There is no need to introduce extra semiconductor doping processes to fabricate another doped region within the original doped region (an N-type or a P-type) on the submount of the diode. Since the number of processes for fabricating the flip chip light-emitting diode package is reduced, there is no need to purchase expensive equipment (ion implant equipment and associated gas supply system and vacuum system) or spend a lot of time to produce the package.

It will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A flip chip light-emitting diode package, comprising:
   a Schottky diode comprising;
      a first conductive type submount having a first surface and a second surface;
      a first ohmic contact layer, disposed on a portion of the first surface of the first conductive type submount;
      a second ohmic contact layer, disposed on the second surface of the first conductive type submount; and
      a Schottky contact layer, disposed on another portion of the first surface of the first conductive type submount and directly connected with the first conductive type submount, wherein the ohmic contact layer and the Schottky contact layer are electrically isolated; and
   a light-emitting diode, disposed on the Schottky diode by flip-chip bonding process, wherein the light-emitting diode and the Schottky diode are connected reverse and in parallel.

2. The flip chip light-emitting diode package of claim 1, wherein the package further comprises a plurality of solder bumps disposed between the Schottky diode and the light-emitting diode so that the Schottky diode and the light-emitting diode are connected reverse and in parallel.

3. The flip chip light-emitting diode package of claim 1, wherein the light-emitting diode further comprises:
   a substrate;
   a semiconductor layer, disposed on the substrate, wherein the semiconductor layer at least comprises a first conductive type doped semiconductor layer, a second conductive type doped semiconductor layer and a light-emitting layer, and the light-emitting layer is disposed on the first conductive type doped semiconductor layer and the second conductive type doped semiconductor layer is disposed on the light-emitting layer;
   a first electrode, disposed on the first conductive type doped semiconductor layer; and
   a second electrode, disposed on the second conductive type doped semiconductor layer.

4. The flip chip light-emitting diode package of claim 3, wherein material forming the first electrode is selected from a group consisting of Ti/Al, Cr/Au, Cr/Pt/Au, Cr/Pd/Au and Cr/Ti/Au.

5. The flip chip light-emitting diode package of claim 3, wherein material forming the second electrode is selected from a group consisting of Ni/Au, Pd/Au, Pt/Au, Ti/Au, Cr/Au, Sn/Au and Ta/Au.

6. The flip chip light-emitting diode package of claim 3, wherein the second electrode comprises an N-type transparent conductive oxide layer or a P-type transparent conductive oxide layer.

7. The flip chip light-emitting diode package of claim 6, wherein material constituting the N-type transparent conductive oxide layer comprises ITO or CTO.

8. The flip chip light-emitting diode package of claim 6, wherein material constituting the P-type transparent conductive oxide layer comprises $CuAlO_2$ or $SrCu_2O_2$.

9. The flip chip light-emitting diode package of claim 1, wherein the first conductive type submount comprises an N-doped material.

10. The flip chip light-emitting diode package of claim 1, wherein the first conductive type submount comprises a P-doped material.

11. The flip chip light-emitting diode package of claim 1, wherein material forming the first conductive type submount is selected from a group consisting of Si, GaAs, GaP, GaN and ZnO.

12. The flip chip light-emitting diode package of claim 1, wherein material forming the ohmic contact layer comprises aluminum (Al).

13. The flip chip light-emitting diode package of claim 1, wherein material forming the Schottky contact layer is selected from a group consisting of titanium (Ti), nickel (Ni), gold (Au), tungsten (W), silver (Ag) and platinum (Pt).

14. A flip chip light-emitting diode package, comprising:
   a Schottky diode group having a plurality of Schottky diodes, wherein the Schottky diodes are electrically connected in series, in parallel or in series and parallel together, each of the Schottky diodes comprises:
      a first conductive type submount having a first surface and a second surface;

a first ohmic contact layer, disposed on portion of the first surface of the first conductive type submount;

a second ohmic contact layer, disposed on the second surface of the first conductive type submount; and a Schottky contact layer, disposed on another portion of the first surface of the first conductive type submount and directly connected with the first conductive type submount, wherein the ohmic contact layer and the Schottky contact layer are electrically isolated; and a light-emitting diode disposed on one of the Schottky diodes by flip-chip bonding process, wherein the light-emitting diode and the Schottky diode group are connected reverse and in parallel.

15. The flip chip light-emitting diode package of claim 14, wherein the package further comprises a plurality of solder bumps disposed between one of the Schottky diodes and the light-emitting diode so that the Schottky diode and the light-emitting diode are connected reverse and in parallel.

16. The flip chip light-emitting diode package of claim 14, wherein the light-emitting diode further comprises:
a substrate;
a semiconductor layer, disposed on the substrate, wherein the semiconductor layer at least comprises a first conductive type doped semiconductor layer, a second conductive type doped semiconductor layer and a light-emitting layer, and the light-emitting layer is disposed on the first conductive type doped semiconductor layer and the second conductive type doped semiconductor layer is disposed on the light-emitting layer;
a first electrode, disposed on the first conductive type doped semiconductor layer; and
a second electrode, disposed on the second conductive type doped semiconductor layer.

17. The flip chip light-emitting diode package of claim 16, wherein material forming the first electrode is selected from a group consisting of Ti/Al, Cr/Au, Cr/Pt/Au, Cr/Pd/Au and Cr/Ti/Au.

18. The flip chip light-emitting diode package of claim 16, wherein material forming the second electrode is selected from a group consisting of Ni/Au, Pd/Au, Pt/Au, Ti/Au, Cr/Au, Sn/Au and Ta/Au.

19. The flip chip light-emitting diode package of claim 16, wherein the second electrode comprises an N-type transparent conductive oxide layer or a P-type transparent conductive oxide layer.

20. The flip chip light-emitting diode package of claim 19, wherein material constituting the N-type transparent conductive oxide layer comprises ITO or CTO.

21. The flip chip light-emitting diode package of claim 19, wherein material constituting the P-type transparent conductive oxide layer comprises $CuAlO_2$ or $SrCu_2O_2$.

22. The flip chip light-emitting diode package of claim 14, wherein the first conductive type submount comprises an N-doped material.

23. The flip chip light-emitting diode package of claim 14, wherein the first conductive type submount comprises a P-doped material.

24. The flip chip light-emitting diode package of claim 14, wherein material forming the first conductive type submount is selected from a group consisting of Si, GaAs, GaP, GaN and ZnO.

25. The flip chip light-emitting diode package of claim 14, wherein material forming the ohmic contact layer comprises aluminum (Al).

26. The flip chip light-emitting diode package of claim 14, wherein material forming the Schottky contact layer is selected from a group consisting of titanium (Ti), nickel (Ni), gold (Au), tungsten (W), silver (Ag) and platinum (Pt).

* * * * *